United States Patent [19]

Haond

[11] Patent Number: 5,089,870

[45] Date of Patent: Feb. 18, 1992

[54] SOI MOS TRANSISTOR WITH A SUBSTRATE-SOURCE CONNECTION

[75] Inventor: Michel Haond, Meylan, France

[73] Assignee: L'Etat Francais represente par le Ministre des Postes, des Telecommunications et de l'Espace (Centre National d'Etudes des Telecommunications), Issy-les-Moulineaux, France

[21] Appl. No.: 534,644

[22] Filed: Jun. 7, 1990

[30] Foreign Application Priority Data

Jun. 19, 1989 [FR] France .................. 89 08428

[51] Int. Cl.⁵ .................. H01L 29/78; H01L 29/04
[52] U.S. Cl. .................. 357/23.7; 357/4; 357/59
[58] Field of Search .................. 357/23.7, 4, 59

[56] References Cited

U.S. PATENT DOCUMENTS 4,423,432 12/1983 Stewart .................. 357/23.7

FOREIGN PATENT DOCUMENTS

| 0304811 | 3/1989 | European Pat. Off. | 357/23.7 |
| 0315424 | 5/1989 | European Pat. Off. | 357/23.7 |
| 2520556 | 12/1982 | France | 357/23.7 |
| 60-258957 | 12/1985 | Japan | 357/23.7 |

Primary Examiner—Jerome Jackson, Jr.
Attorney, Agent, or Firm—Lowe, Price, LeBlanc & Becker

[57] ABSTRACT

An SOI MOS transistor comprises at least a highly doped lateral stripe (13, 14) of the same conductivity type as the substrate (3). This stripe extends along the edge of the substrate and of the source region (5) and is shorted with the source region through the conductive source layer (11).

24 Claims, 3 Drawing Sheets

SOI MOS TRANSISTOR WITH A SUBSTRATE-SOURCE CONNECTION

BACKGROUND OF THE INVENTION

The present invention relates to the field of MOS transistors manufactured in a thin silicon layer formed on an insulating substrate.

In Silicon On Insulator (SOI) technology, elementary transistors are formed in portions of a monocrystalline silicon layer formed on an insulating substrate. Two main types of SOI technologies can be differentiated according to the way in which the individual transistors are insulated one from the other.

According to a first technology, each of the MOS transistors is formed in a mesa of the thin monocrystalline silicon layer, with each mesa being separated from the others by removal of the thin silicon layer.

According to a second technology, regions the transistors are formed are separated from each other by a dielectric insulation, generally formed by oxidizing the entire thin layer except regions where the transistors are to be formed.

First, the state of the prior art and the present invention are described for the case of mesa-type technology; then, a variant of the invention is disclosed for dielectric insulation technology.

FIGS. 1A and 1B are a sectional and top views of a conventional MOS transistor formed on a silicon on insulator structure (FIG. 1A being a section view along line A—A of FIG. 1B).

As shown in FIGS. 1A and 1B, such a structure is formed from a thin monocrystalline silicon layer on insulating substrate 1. This thin silicon layer is etched to leave in place only a block, having a central portion corresponding to a low doped substrate 3 of a first conductivity type, here P-type, lowly doped in the upper portion where a channel is to be formed; outer regions of the block correspond to source 5 and a drain 6, both highly N+ doped to be, of an opposite conductivity type from the substrate. A conductive electrode in the form of gate 7 is formed above substrate channel region 3. Insulating layer 8 is interposed between gate 7 end region 3. Usually, gate 7 is made of polycrystalline silicon and the gate insulator 8 of silicon oxide. In the conventional structure, insulating spacers 9, usually made of silicon oxide or silicon nitride, are formed on both sides of gate 7 and serve, on the one hand, to implant the drain and source according to the represented shape, that is, more deeply penetrating under the gate in their upper portion and, on the other hand, to ensure insulation between the gate contact 7 and the drain and source contacts, represented as crosses surrounded by squares in the top view of FIG. 1B.

Moreover, as known in the field of MOS transistor utilization, it is desirable to provide a contact between substrate or channel region 3 and source region 5 to avoid various parasitic effects, namely:

1) a "kink" effect associated with the presence of a floating substrate channel region 3 when the silicon on insulator layer is too thick and/or too highly doped (this effect appears in the form of a bump on the drain-current/drain-voltage characteristic);

2) the occurrence of a parasitic bipolar transistor which introduces hysteresis in the transistor current-voltage characteristics; and 3) the occurrence of a parasitic edge transistor associated with the lateral insulation.

To form such a contact between the substrate and the source, the conventional method such as illustrated in FIG. 1B, consists in (1) providing an extension 10 of the monocrystalline silicon portion corresponding to the substrate or channel 3, and (2) forming a contact on extension 10, the contact being connected through a metallization to the contact of source 5. Extension 10 must be doped with the same conductivity type as dopant substrate that of, but with a higher doping level (P+ in the given example). The drawback of this conventional structure is that it increases the surface of each elementary transistor. With present technologies, the surface area necessary for a contact is substantially of the same order of magnitude as the areas of the source, drain or channel of a transistor. By way of example, in a prior art implementation, the thickness of the monocrystalline silicon layer is about 200 nm and each rectangular transistor block has sides of about 2000×5000 nm; the sides of region 10, the only function of which is to establish a contact, must be about 2000×2000 nm. Moreover, an access resistor between this contact and the substrate becomes prohibitive as the sizes of the transistors decrease.

An object of the invention is to provide a new and improved MOS SOI transistor structure, wherein contact is between the channel and source is provided, without substantially increasing the transistor surface area.

Another object of the invention is to provide a specific method of manufacturing such a structure as an SIO mesa-type MOS transistor.

A further object of the invention is to provide a specific method of manufacturing such a structure as a dielectrically insulated SOI MOS transistor.

SUMMARY OF THE INVENTION

To achieve those objects and others, the invention provides an MOS transistor formed in an insulated portion of a thin monocrystalline silicon layer on an insulator layer, comprising a highly doped lateral stripe of the same conductivity type as that of the MOS transistor channel region wherein the stripe extends along an edge of the channel region and the MOS transistor source and wherein the stripe short circuits the source region to the source layer electrode.

A method of manufacturing an MOS transistor according to a first embodiment of the invention comprises, after etching mesa areas, and while the mask (oxide-nitride) which has served to delineate the mesas is still in place, the following steps:

coating the whole structure with a polycrystalline silicon layer;

etching this polysilicon layer through anisotropic etching so as to leave in place only a spacer surrounding each mesa;

etching the spacer for leaving in place only the desired lateral stripes extending along a portion of the substrate and along the adjacent source region;

conventionally continuing to form a mesa-type SOI MOS transistor.

A manufacturing method of a MOS transistor according to a second embodiment of the invention comprises, after the step of etching a first mask serving to delineate oxidation regions separating individual transistors, while this mask (oxide-nitride) is still in place, and before the oxidation step, the following steps:

forming a second mask comprising an aperture at least along a lateral stripe overlapping with respect to the source and substrate regions;

implanting a dopant of the conductivity type of the substrate at a high doping level;

annealing;

eliminating the second mask;

oxidizing for insulating the portions wherein are formed the MOS transistors; and conventionally continuing the manufacture of a SOI MOS transistor of the dielectrically insulated type.

BRIEF DISCLOSURE OF THE DRAWINGS

The foregoing and other objects, features and advantages of the invention will be apparent from the following detailed description of preferred embodiments as illustrated in the accompanying drawings wherein:

FIGS. 3A–8A are schematic to sectional views of, successive manufacturing steps of a mesa-type MOS transistor according to the invention, and FIGS. 3B–8B are corresponding top views; and FIGS. 9A–11A are successive section views of a method of manufacturing a dielectrically insulated transistor according to the invention, while FIGS. 9B–11B are corresponding top views.

Figure 1A:
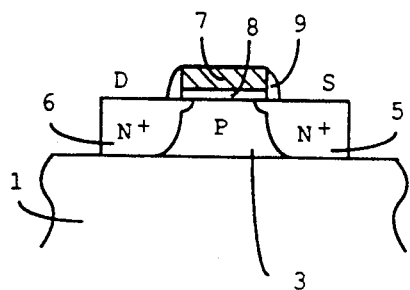
FIGS. 1A and 1B are a section view and a top view, respectively, of a prior art SOI MOS transistor.
Figure 1B:
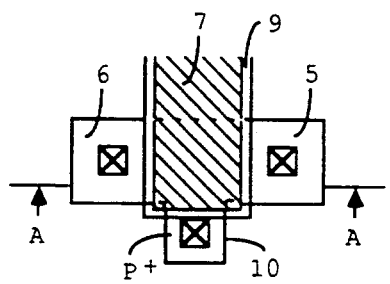

In the various figures, the same reference numerals designate the same components or layers. As is conventional in the field of integrated circuit representation, the various drawings are not drawn to scale either inside one figure or between figures in order to facilitate the legibility of the drawings. Those skilled in the art will be able to refer to the conventionally known values or to those specifically indicated in the present description.

Figure 2A:
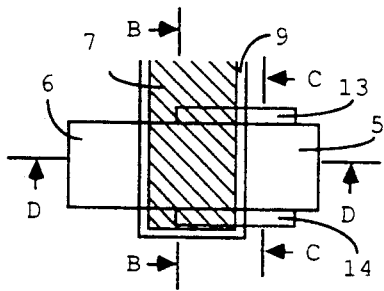
FIGS. 2A, 2B, 2C and 2D are a top view and various section views, respectively, of a mesa-type transistor according to the invention.
Figure 2B:
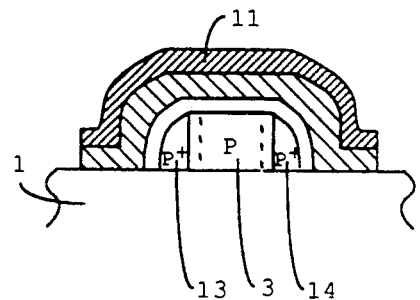
Figure 2C:
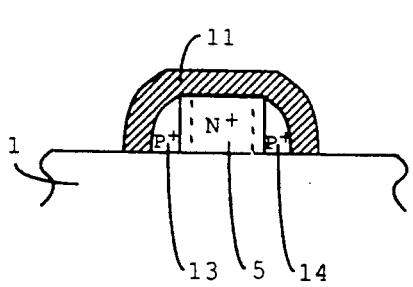
Figure 2D:
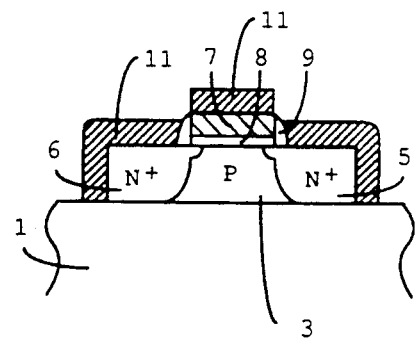

FIGS. 2A–2D are illustrations of a mesa-type transistor according to the invention. FIGS. 2B, 2C and 2D are section views through planes BB, CC and DD in the top view of FIG. 2A. In these figures are again illustrated, the substrate 1 and the monocrystalline silicon block containing the MOS transistor including substrate or channel region 3, source region 5 and drain region 6, gate electrode 7 and lateral spaces 9 between the gate, source and drain. In addition, in FIGS. 2B, 2C and 2D, but not in FIG. 2A, is illustrated upper silicide layer 11 which is automatically localized on the apparent mono or polycrystalline silicon regions.

According to the invention, at least one and preferably two lateral stripes 13 and 14 of conductive polycrystalline silicon of the same conductivity type as that of the substrate 3 are added to a conventional SOI transistor structure. Stripes 13 and 14 extend along both sides of a transistor block in order to be laterally in contact with a portion of substrate 3 region and at least a portion of source regions. Since stripes 13 and 14 have the same P conductivity type as substrate 3, those stripes are electrically in contact with the substrate and source silicide region 11 to establish contact between stripes 13 and 14 and source 5. Moreover, it will be noted that, due to the various annealing operations performed after the implantation steps, dopant of regions 13 and 14 partially diffuses in the lateral portions of substrate region 3 and source region 5, as indicated by doted lines in FIGS. 2B and 2C.

With such a structure, a substrate/source contact is obtained without substantially increasing the size of an SOI MOS transistor. Hereinafter, it will be established that such a structure is easily implementable in a mesa-type structure or in a dielectrically insulated structure.

FIGS. 3A–8A are section views and FIGS. 3B–8B are corresponding top views of successive manufacturing steps of a mesa-type MOS transistor with a i.e. channel source shorting according to the invention.

Figure 3A:
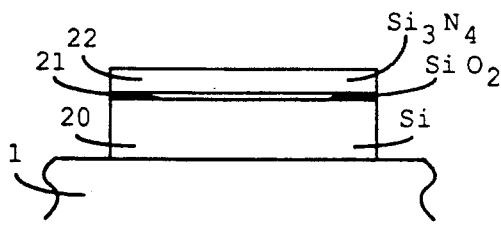
Figure 3B:
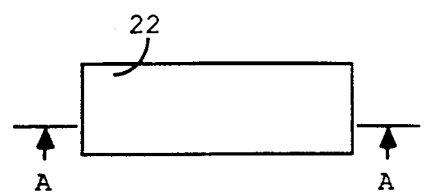

In FIG. 3A is shown a conventional preliminary manufacturing step wherein, considering a thin layer of monocrystalline silicon formed on an insulator 1, a silicon block 20 is delineated while providing a coating by a masking layer, for example a sandwich of silicon oxide ($SiO_2$) 21 and of silicon nitride 22, the whole set having for example a thickness of about 80 nm.

Figure 4A:
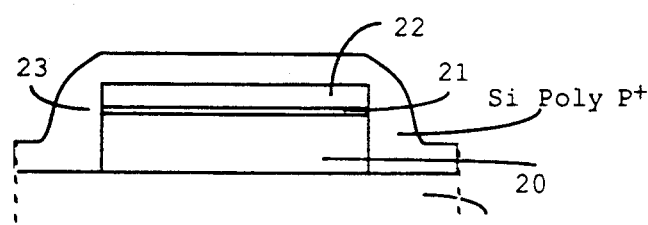
Figure 5A:
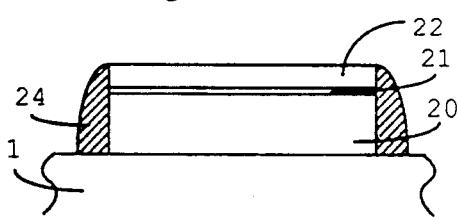
Figure 5B:
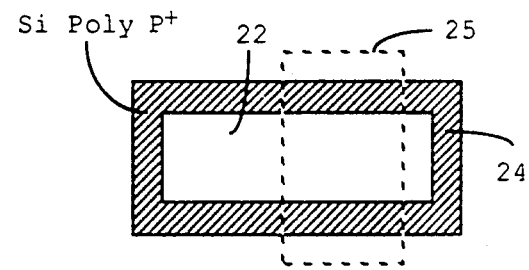
Figure 6A:
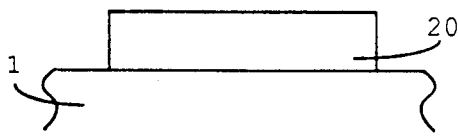
Figure 6B:
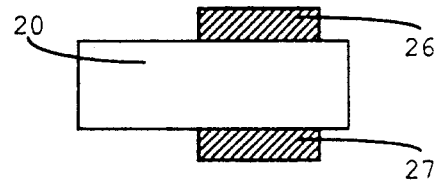
Figure 7A:
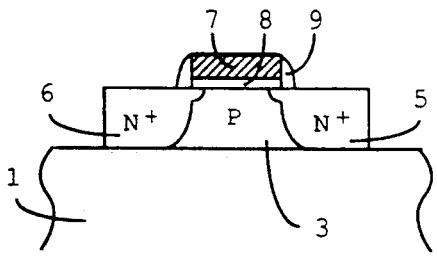
Figure 7B:
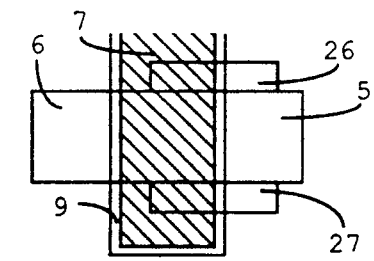

At the following step, illustrated in FIG. 4A, the whole layer is coated with a polycrystalline silicon layer 23. In an embodiment, this polycrystalline silicon can initially be highly P+ doped. Then, the polycrystalline silicon layer 23 is submitted to a selective anisotropic etching, for example by plasma etching to obtain a block (20, 21, 22) surrounded by a P+-type polycrystalline silicon spacer 24 and, as shown in FIG. 5B, this block is partially coated with a mask which covers at least a portion of the region where the central substrate region has to be formed and of the region where the source has to be formed. Then, one makes a selective etching of the polycrystalline silicon which occurs at other places than that of mask 25 and, after elimination of the silicon nitride layer 22 and silicon oxide layer 21, one obtains a monocrystalline silicon block 20 provided with localized spacers 26, 27 longitudinally extending over the edges of the substrate and source regions.

Then, the conventional manufacturing steps of a MOS transistor are carried out to form a polycrystalline silicon gate 7 above a gate oxide 8. Afterwards, one forms a first source and drain implantation, then the insulating gate spacers 9, and a second source and drain implantation is achieved for obtaining the substrate region 3 and the source and drain regions 5 and 6.

Figure 8A:
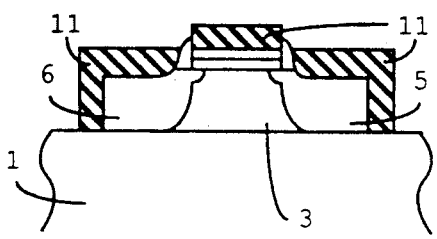
Figure 8B:
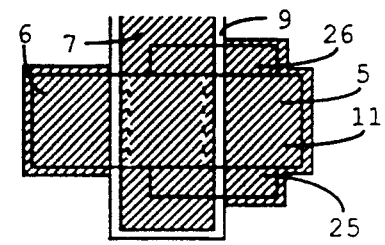

Lastly, as shown in FIGS. 8A and 8B, it is possible to form a metal silicide layer which grows on the apparent silicon and polycrystalline silicon regions. This silicide is referenced 11 as in FIG. 2D. It will be noted, as clearly shown in FIG. 8B, that the silicide layer 11 formed above the source region is also formed above the polycrystalline silicon regions 26 and 27 and ensures the desired source/substrate shorting. Moreover, although not shown in the figures, it will be noted that after the successive implantation and annealing steps, the highly doped polycrystalline silicon region corresponding to spacers 26 and 27 causes the diffusion of P+-type dopants in the adjacent source and substrate regions.

On the other hand, those skilled in the art will note that the concentration of P+-type dopant in regions 26 and 27 has to be higher than the concentration of N+-type dopant in the drain and source regions so that the source implantation does not neutralize doping of the lateral regions. For example, if the source implantation dose is of about 2 to $4.10^{15}$ phosphorous or arsenic atoms per $cm^2$, the lateral stripe implantation will be about 4 to $6.10^{15}$ boron atoms per $cm^2$. Lastly, considering FIG. 5A, it will also be noted that, after elimination of layers 21 and 22 (which have a thickness of about 80 nm only), polycrystalline silicon protuberances remain in place. In fact those protuberances will disappear or will at least be attenuated by the subsequent successive oxidizing steps and elimination of oxide since, when oxidation is carried out, the polycrystalline silicon is oxidized substantially faster than the monocrystalline silicon.

An embodiment of a structure according to the invention in case of manufacturing dielectrically insulated SOI transistor will now be described in relation with the section views of FIGS. 9A-11A and the top views of FIGS. 9B-11B.

Figure 9A:
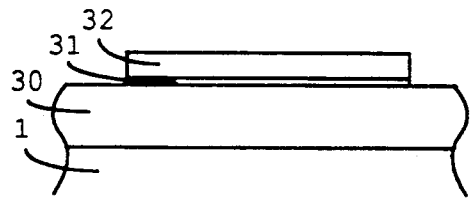
Figure 9B:
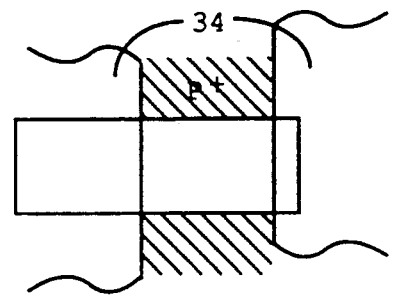

FIG. 9A shows a thin monocrystalline silicon layer 30 formed on an insulating substrate 1, the regions where it is desired to form transistors being coated with an anti-oxidation layer, constituted for example by a sandwich of silicon oxide 31 and silicon nitride 32. Then, as shown in FIG. 9B, one forms a mask 34 comprising an aperture overlapping the substrate and source regions of the transistor that it is desired to form and an implantation of a P+-type dopant (of the same type as that of the substrate) is carried out, this implantation being masked, on the one hand, by mask 34 and, on the other hand, by the silicon nitride layer 32.

Figure 10A:
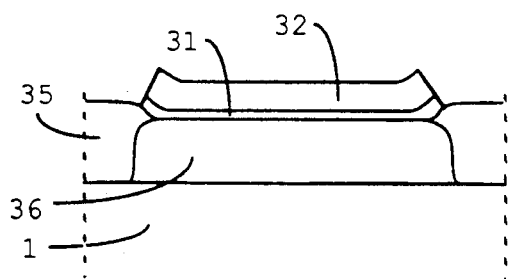
Figure 10B:
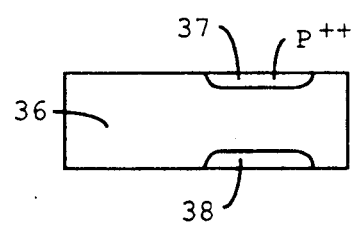

Then, as illustrated in FIGS. 10A and 10B, a thick insulation oxide is grown for separating portions of the mono-crystalline silicon. During this oxidation step, the P+-type dopant implanted during the step illustrated in FIG. 9 laterally diffuses in the monocrystalline silicon portion 36 for forming P+ stripes 37 and 38 such as illustrated in FIG. 10B.

Figure 11A:
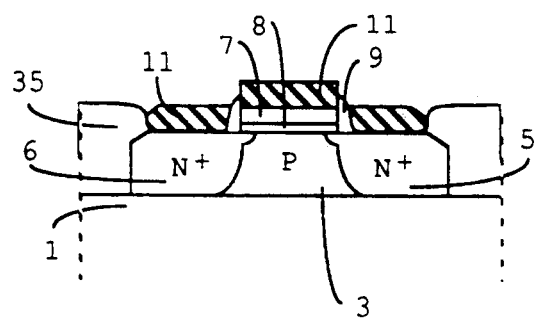
Figure 10B:
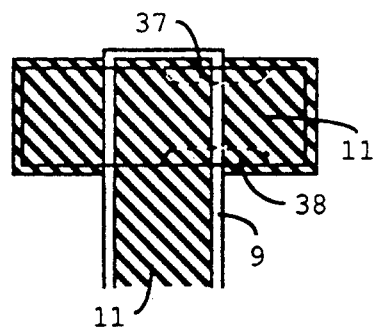

Then, one carries out the successive conventional steps for manufacturing an MOS transistor and the final silicide layer 11 or another metallization layer formed on the source region shorts the superficial regions 37 and 38 (as substrate as the lateral regions) with the source region. FIG. 11A uses the same references as FIGS. 8A and 2D.

Thus, the invention permits to easily manufacture according to either mesa-type or dielectrically insulated type technologies blocks of MOS transistors with substrate-source shorts. Indeed, no accurate alignment is required between the mask designed to delineate lateral stripes and the other masks used in the MOS transistor manufacturing process.

On the other hand, those skilled in the art will note that various ways of manufacturing MOS transistors are compatible with the invention, particularly as regards doping types and the provision of additional steps such as channel implantations. Also, the contacts do not necessarily require the use of metal silicides.

I claim:

1. An MOS transistor formed in a substantially rectangular insulated portion of a thin monocrystalline silicon layer on an insulator, said transistor comprising a drain region of a first conductivity type coated with a drain conductive layer, a substrate region of a second conductivity type coated with an insulating layer overlaid by a gate conductive layer, the first and second conductivity types differing from each other, a source region of the first conductivity type coated with a source conductive layer, said drain region, substrate region and source region being successively located in a longitudinally extending direction, a pair of highly doped lateral stripes of the second conductivity type extending in said longitudinal direction along opposite parallel edges of both the substrate region and source region, said stripe contacting said substrate and source regions and being contacted by said source conductive layer, the edges of the substrate region and the source region being on the same side of the silicon layer.

2. The MOS transistor of claim 1 wherein the conductive source layer is a metal silicide layer.

3. The MOS transistor of claim 1 wherein said insulated portion is dielectrically insulated, and wherein said lateral stripe is an overdoped region directly formed in a lateral portion of regions normally corresponding to the substrate region and the source region.

4. The transistor of claim 1 wherein the dopant in the stripe partially diffuses into lateral portions of the substrate region.

5. An MOS structure comprising an insulator carrying a thin monocrystalline silicon layer including a substantially rectangular insulated portion of the mesa-type so it is separated from other insulating regions of the transistor by a gap in said monocrystalline silicon layer, an MOS transistor formed in the insulated portion of the monocrystalline silicon layer, the MOS transistor including a drain region of a first conductivity type coated with a drain conductive layer, a substrate region of a second conductivity type coated with an insulating layer overlaid by a gate conductive layer, the first and second conductivity types differing from each other, a source region of the first conductivity type coated with a source conductive layer, said drain region, substrate region and source region being successively located in a longitudinally extending direction, at least one highly doped lateral stripe of the second conductivity type extending in said longitudinal direction along an edge of the substrate region and an edge of the source region, said stripe contacting said substrate and source regions and being contacted by said source conductive layer, said lateral stripe including at least a portion of a highly doped spacer consisting essentially of polycrystalline silicon, the edges of the substrate region and the source region being on the same side of the silicon layer.

6. An MOS structure comprising an insulator carrying a thin monocrystalline silicon layer including a substantially rectangular insulated portion, an MOS transistor formed in the insulated portion of the monocrystalline silicon layer, the MOS transistor including a drain region of a first conductivity type coated with a drain conductive layer, a substrate region of a second conductivity type coated with an insulating layer overlaid by a gate conductive layer, the first and second conductivity types differing from each other, a source region of the first conductivity type coated with a source conductive layer, said drain region, substrate region and source region being successively located in a longitudinally extending direction, a pair of highly doped lateral stripes of the second conductivity type extending in said longitudinal direction along opposite parallel edges of both the substrate and source regions, said stripe contacting said substrate and source regions and being contacted by said source conductive layer, the edges of the substrate region and the source region being on the same side of the silicon layer.

7. The structure of claim 6 wherein the conductive source layer is a metal silicide layer.

8. The structure of claim 6 wherein said insulated portion is of the mesa-type so it is separated from other insulating regions of the transistor by a gap in said monocrystalline silicon layer, and wherein said lateral stripe includes at least a portion of a highly doped silicon spacer.

9. The structure of claim 6 wherein said insulated portion is dielectrically insulated, and wherein said lateral stripe is an overdoped region directly formed in a lateral portion of regions normally corresponding to the substrate region and the source region.

10. The structure of claim 6 wherein dopant in the stripe partially diffuses into lateral portions of the substrate region.

11. The structure of claim 8 wherein said highly doped silicon spacer consists essentially of polycrystalline silicon.

12. The structure of claim 5 wherein the conductive source layer is a metal silicide layer.

13. The structure of claim 6 wherein said insulated portion is of the mesa-type so it is separated from other insulating regions of the transistor by a gap in said monocrystalline silicon layer, and wherein said lateral stripe includes at least a portion of a highly doped silicon spacer.

14. The structure of claim 13 wherein said highly doped silicon spacer consists essentially of polycrystalline silicon.

15. The structure of claim 5 wherein said insulated portion is dielectrically insulated, and wherein said lateral stripe is an overdoped region directly formed in a lateral portion of regions normally corresponding to the substrate region and the source region.

16. The structure of claim 5 wherein dopant in the stripe partially diffuses into lateral portions of the substrate region.

17. The structure of claim 5 wherein a pair of said stripes are provided, each of said stripes extending along opposite parallel edges of the substrate region and the source region.

18. The MOS transistor according to claim 1, wherein said insulated portion is of the mesa-type so it is separated from other insulating regions of the transistor by a gap in said monocrystalline silicon layer, and wherein said lateral stripe includes at least a portion of a highly doped silicon spacer.

19. The MOS transistor according to claim 18, wherein said highly doped silicon spacer consists essentially of polycrystalline silicon.

20. An MOS transistor formed in a substantially rectangular insulated portion of a thin monocrystalline silicon layer on an insulator, said transistor comprising a drain region of a first conductivity type coated with a drain conductive layer, a substrate region of a second conductivity type coated with an insulating layer overlaid by a gate conductive layer, the first and second conductivity types differing from each other, a source region of the first conductivity type coated with a source conductive layer, said drain region, substrate region and source region being successively located in a longitudinally extending direction, said insulated portion being of the mesa-type so it is separated from other insulating regions of the transistor by a gap in said monocrystalline silicon layer, at least one highly doped lateral stripe of the second conductivity type extending in said longitudinal direction along an edge of the substrate region and an edge of the source region, said stripe contacting said substrate and source regions and being contacted by said source conductive layer, said lateral stripe including at least a portion of a highly doped spacer consisting essentially of polycrystalline silicon, the edges of the substrate region and the source region being on the same side of the silicon layer.

21. The transistor of claim 20 wherein the dopant in the stripe partially diffuses into lateral portions of the substrate region.

22. The transistor of claim 20 wherein a pair of said stripes are provided, each of said stripes extending along opposite parallel edges of the substrate region and the source region.

23. The MOS transistor according to claim 20, wherein the conductive source layer (11) is a metal silicide layer.

24. The MOS transistor according to claim 20, wherein said insulated portion is dielectrically insulated, and wherein said lateral stripe is an overdoped region directly formed in a lateral portion of regions normally corresponding to the substrate region and the source region.

* * * * *